United States Patent [19]

Amano et al.

[11] Patent Number: 4,470,038

[45] Date of Patent: Sep. 4, 1984

[54] SHIFT CONTROL SYSTEM FOR KEYBOARDS

[75] Inventors: Katsumi Amano, Oume; Kiyoshi Kinoshita, Tokyo, both of Japan

[73] Assignee: Tokyo Shibaura Denki Kabushiki Kaisha, Kawasaki, Japan

[21] Appl. No.: 361,247

[22] Filed: Mar. 24, 1982

[30] Foreign Application Priority Data

May 14, 1981 [JP] Japan ............................... 56-71443

[51] Int. Cl.³ ............................................... G08C 9/00
[52] U.S. Cl. ............................. 340/365 S; 340/365 R; 340/365 E; 235/145 R
[58] Field of Search ......... 340/365 S, 365 R, 365 VL, 340/365 E; 364/709, 711, 712; 235/145 R; 179/90 K; 178/17 C; 400/479, 479.1, 477, 476

[56] References Cited

U.S. PATENT DOCUMENTS

| | | | |
|---|---|---|---|
| 3,742,137 | 6/1973 | Garland | 340/365 S |
| 3,778,819 | 12/1973 | Bhagawan et al. | 340/365 S |
| 3,846,758 | 11/1974 | Gosset | 400/477 |
| 4,121,048 | 10/1978 | Deu Choudhury | 340/365 S |

OTHER PUBLICATIONS

Intel Component Data Catalog 1979; Numerical and Functional Indexes; Microprocessor Peripherals 8278 Programmable Keyboard Interface.

*Primary Examiner*—Donnie L. Crosland
*Attorney, Agent, or Firm*—Oblon, Fisher, Spivak, McClelland & Maier

[57] ABSTRACT

A shift control system for keyboard having plural character keys and at least one shift key arranged in a predetermined key matrix and the positions of which are defined by respective matrix codes, including a keyboard controller under the control of a central processing unit for determining a depression of any of the keys of the key matrix. The matrix codes of the shift keys are predetermined and so identified. The key matrix is scanned and the matrix codes of any depressed keys are determined and compared with the predetermined matrix code of the shift keys. Keycodes are formed for each depressed key based on the matrix codes produced for the respective key and based on whether or not a shift key depression is determined.

7 Claims, 9 Drawing Figures

SHIFT CONTROL SYSTEM FOR KEYBOARDS

BACKGROUND OF THE INVENTION

1. Field of the Invention

This invention relates to shift control systems for keyboards, and more particularly to a shift control system suitable for general keyboards, wherein the shift keys are disposed in a common matrix arrangement with the general keys.

2. Description of the Prior Art

Currently, general keyboards of the scan type sense the ON and OFF condition of the key switches arranged as a matrix by means of a central processing unit or an LSI circuit for controlling the keyboards as shown in FIG. 1. As shown in FIG. 1, the prior art keyboard has a keyboard controller 1, scan lines 2, a decoder 3, return lines 4, a keyboard matrix 5, and sense lines for the ON and OFF states of the shift keys. The keyboard controller 1 scans the key switches arranged in a matrix to sense the ON and OFF states, and if one of the keyswitches in "ON", the controller repeats the scan to confirm the "ON" state of the switch and stores the address X and Y of the "ON" switch in a buffer memory and requires an interrupt to the CPU. Currently, most keyboards have fifty keyswitches. However, the above method restricts the possibility of reducing the number of key switches to display the same number of characters and has the disadvantage of complicated operation if the number of keys are increased to accomodate more display characters.

One solution of the aforesaid problem has been to use shift keys to select categories of alphabets, numerals and special symbols enabling one or more key switch to generate three different display characters. In this case, the keyboard must have a sense line 6 for each shift key and a separate register for each sense lines 6, so that the circuitry becomes complicated, resulting in high manufacturing cost. Furthermore, the keyboards are not conducive for general use, because it is difficult to change the key arrangement after it has been designed. Therefore use of the prior art keyboards with various devices requires design of special circuits for each device.

SUMMARY OF THE INVENTION

It is accordingly a principal object of this invention to provide a new and improved shift control sytem for a keyboard in which the shift keys are arranged in a common matrix with the general keys matrix to simplify the circuitry.

It is still another object of this invention to provide a new and improved general use shift control system for a keyboard which enables the arrangement of the keys to be easily changed.

It is yet another object of the invention to provide a new and improved shift control system for a keyboard in which the shift keys can be arranged anywhere in the matrix, making it unnecessary to modify the keyboard itself to effect an operational change.

It is a further object of the invention to provide a new and improved shift control sytem for a keyboard which is easy to standardize.

These and other objects are achieved according to the invention by providing a new and improved shift control system for a keyboard including plural character keys and at least one shift key arranged in a key matrix wherein the positions of the character keys and the shift key are defined by respective matrix codes, including a keyboard controller for controlling the keyboard, a central processing unit coupled to the keyboard controller to control operation of the controller and the keyboard, notifying means for identifying the matrix code of the at least one shift key and for storing the matrix code of the shift key, scanning means for scanning the key matrix and for determining which if any of the character keys and the shift key are depressed, wherein the scanning means forms matrix codes corresponding to the depressed keys, a comparator for comparing the matrix codes produced by the scanning means with the matrix code of the shift key as identified by the notifying means to determine if one of the shift keys has been depressed, whereupon a shift signal is produced, and key code forming means for forming keycodes based on the matrix codes produced by the scanning means and the shift signal and for sending the keycodes to the CPU for use thereby.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
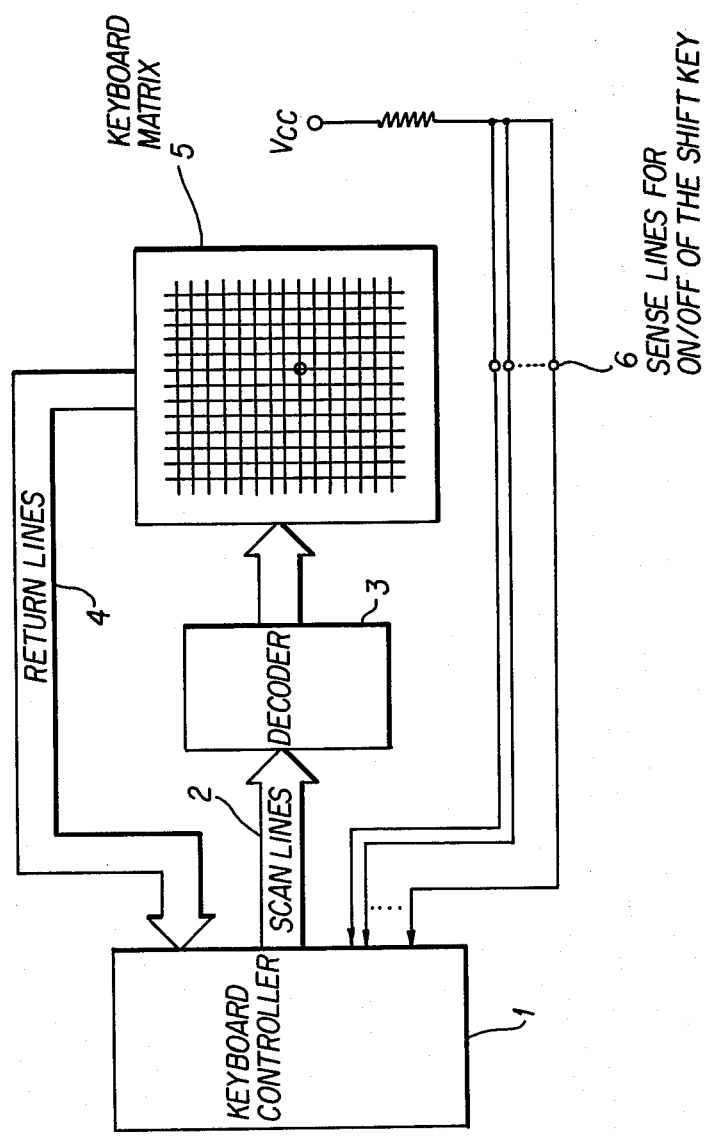
FIG. 1 is a block diagram of the prior art keyboard system.
Figure 2:
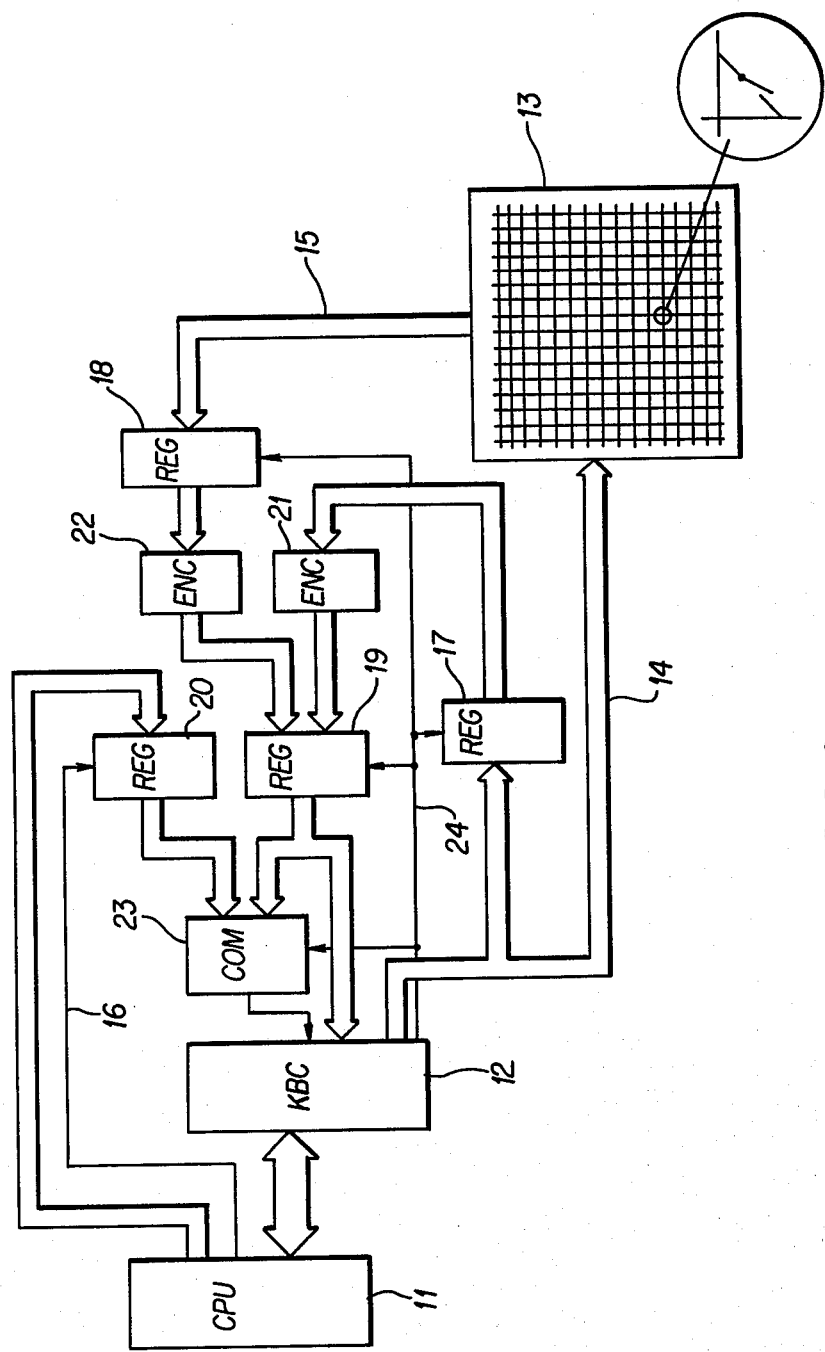
FIG. 2 is a block diagram of the keyboard shift control system according to this invention.

Referring now the drawings, wherein like reference numerals designate identical or corresponding parts throughout the several views, and more particularly to FIG. 2 thereof, in FIG. 2 the shift control system for the keyboard includes a central processing unit (CPU) 11, a keyboard controller 12 and a scan type keyboard 13. The keyboard controller 12 is a programmable interface device designed to interface the keyboard 13 and the CPU 11. The keyboard controller 12 includes a scanning counter to count the number of the keys. The key matrix of the keyboard 13 includes at least one shift key in addition to plural character keys. The scan lines 14 provide scanning signals to the encoder 21 via the register 17. The return lines 15 provide raw key data to the encoder 22 via the register 18. The control line 16 provides a control signal to the register 20 from the CPU 11. The outputs of the encoders 21 and 22 are coupled to the comparator 23 and the keyboard controller 12 through the register 19. The comparator 23 has another input from the register 20. The CPU 11 writes the matrix code identifying the matrix position of the shift key into the register 20. The comparator 23 compares the return data with the matrix code of the shift key to determine if the shift key has just been operated.

Figure 3:
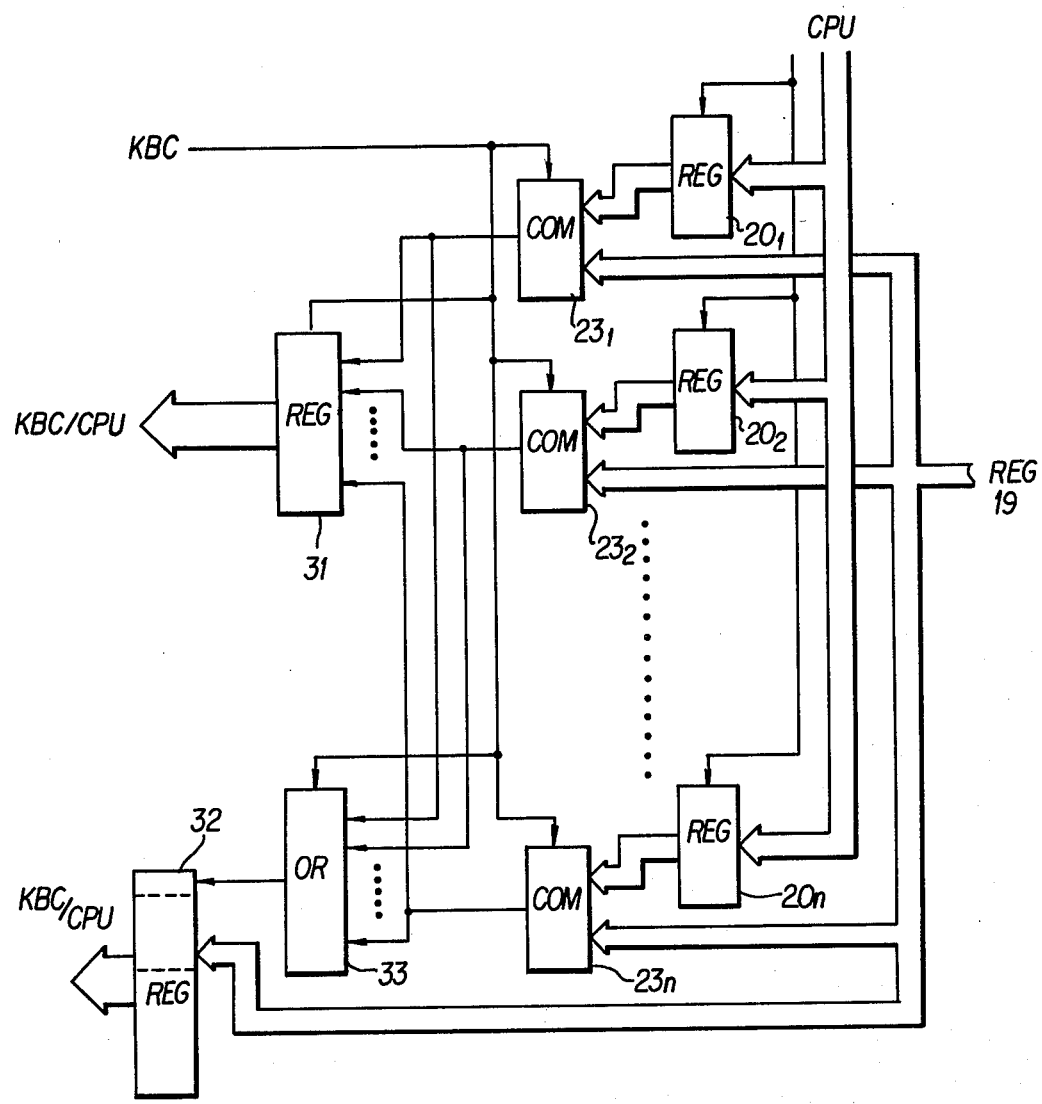
FIG. 3 is a block diagram of another embodiment of the keyboard shift control system according to this invention.

In FIG. 3 another embodiment of the invention is shown in block diagram form. The difference between the embodiments of FIG. 2 and FIG. 3 is that in the FIG. 2 embodiment there is one shift key, however, in the embodiment in FIG. 3 there are plural shift keys. In correspondence with the increase of the number of shift keys, there are provided respective registers $20_1$–$20_n$ and comparators $23_1$–$23_n$. The outputs of the comparators are applied as inputs to the OR gate 33. The register 31 is a status register provided to indicated the status of the each shift keys. The output of the OR gate 33 is supplied to the register 32 along with the outputs of the register 19 which instantly latches the outputs of the encoders 21 and 22. Thus, register 32 stores not only the contents latched in the register 19 but also stores an output of the OR gate 33, such that if one of the shift keys has been operated the most significant bit of the register 32 is "1".

Referring to FIG. 2, the operation of the invention will be explained as follows. The CPU 11 preliminarily writes the matrix code of the shift key designated by the programs into the register 20. The writing of the shift key matrix code is controlled by the control signal 16 and defines the position of the shift key in the key matrix. The keyboard controller 12 begins to scan the key matrix 13. If there are any keys pushed down, the return lines 15 transfer the signals. The return signals are stored in the register 18 and are coded by the encoder 22. While the codes of the return lines are being made, the scan lines 14 are stored in the register 17 and are coded by the encoder 21. The outputs of both encoders 21 and 22 are stored in the register 19. Therefore it is possible to determine whether or nor the shift key is depressed by comparing the contents of the register 19 with that of the register 20, because the matrix code of the shift key was preliminarily stored in the register 20 as aforementioned. The keyboard controller 12 transmits the keycodes including the status of the shift key to the CPU. The keyboard controller controls the registers 17, 18 and 19 and the comparator 23 by the control timing signals 24.

In the case of plural shift keys as shown in FIG. 3, the register 31 is provided to indicate the status of the shift keys, that is, which shift key is depressed. In this embodiment the bit corresponding to a respective depressed shift key is set to "1". The register 31 must have a number of bits equal to the number of shift keys. The register 32 stores the keycodes and is designed such that if one of the shift keys is operated the most significant bit becomes "1". The keyboard controller 12 operates to make its most significant output bit "1". If the most significant bit of the register 32 is "1", the keyboard controller sends the data of register 32 to the CPU and then also sends the contents of the register 31 to the CPU 11. However, if the most significant bit of the register 32 is "0" indicating no shift key is depressed, the keyboard controller does not send the register 31 data to the CPU since no shift key is depressed. If the CPU 11 receives the data of register 32 in which the most significant bit is "1" from the keyboard controller 12, the CPU 11 only generates the keycodes after receiving the corresponding shift status data. If the CPU 11 receives the data of register 37 in which the most significant bit is "0", the CPU 11 generates the keycodes immediately, concluding that no shift key is depressed. In this embodiment although the operation of any of the shift keys is indicated by the most significant bit of the register 32, others of the bits can be used for this purpose, for example, the least significant bit or another intermediate bit. Further, it is a simple design task to employ negative logic in the control operations. These alternatives can be accommodated under control of the CPU.

Figure 4:
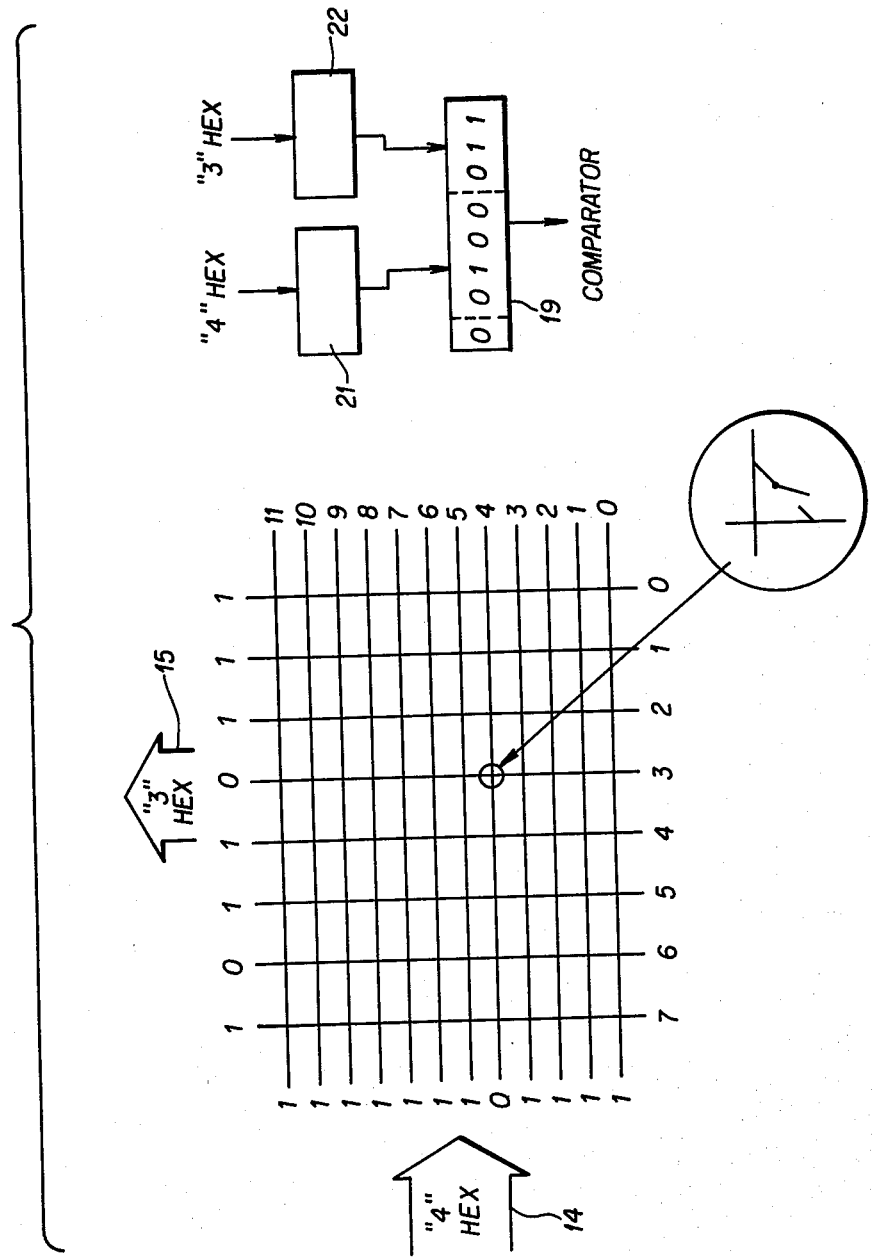
FIG. 4 is a schematic diagram illustrating the relationship between a key depression in the key matrix and the resulting scanning and return codes thereby produced.

Referring to FIG. 4, the coding of the encoders 21 and 22 is nextly explained. In FIG. 4, operations of the key matrix are shown when the key identified by the symbol 0 is depressed. In the example prior to scanning each of the scan lines 14 (0–11) and the return lines 15 (0–7) are "1". If the scan line 4 becomes "0", the return lines 3 becomes "0" at the depressed key. The encoders 21 and 22 read the number 4 (0100) of the scan lines 14 and the number 3 (011) of the return lines 15 and make their respective coding. In the embodiment although the register 19 has eight bits for the convenience of the keyboard controller 12, the number of bits can be selected based on user convenience. Namely in the embodiment although the number of scan lines is sixteen and there are eight return lines, if more lines are needed, the additional lines can be accommodated by increasing the number of bits of the register 19.

Figure 5:
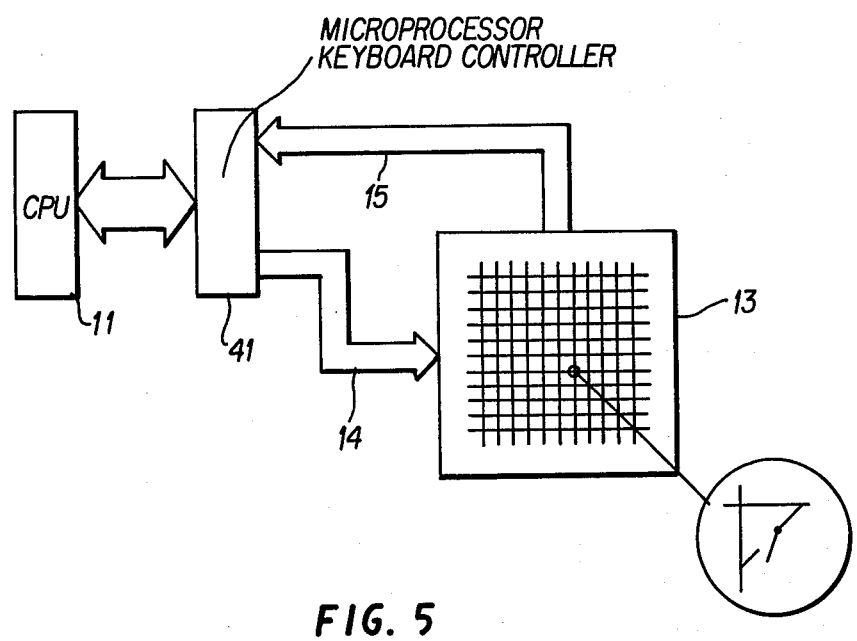
FIG. 5 is a block diagram of another embodiment of the present invention.
Figure 6A:
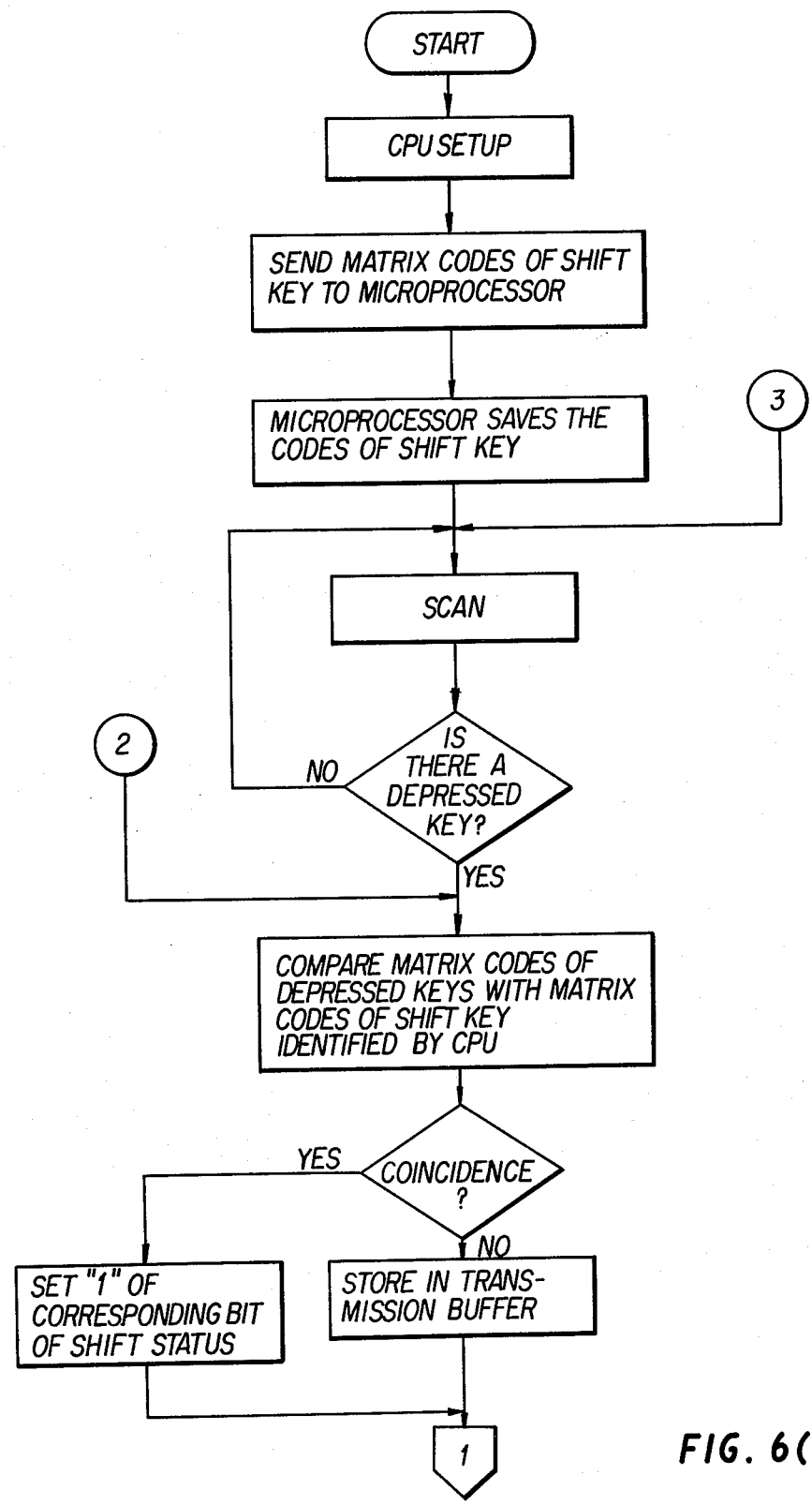
FIGS. 6(A) and 6(B) are flow charts of the operation of the embodiment shown in FIG. 5.
Figure 6B:
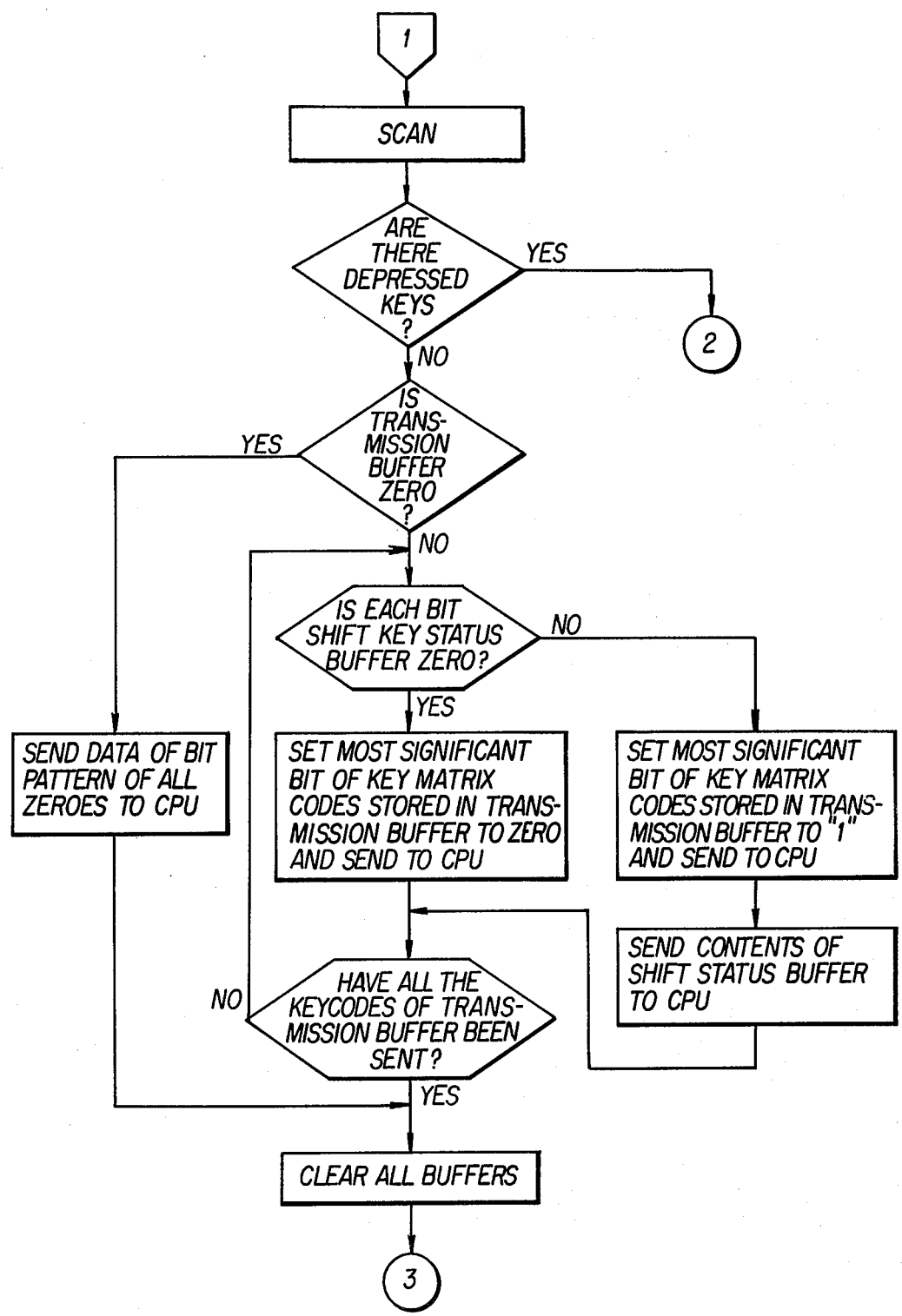

In FIG. 5, the keyboard controller employ a single chip microprocessor 41. Operation of this embodiment is nextly explained referring to the flow chart of the firmware operations shown in FIG. 6. In comparison with the embodiments in FIG. 2 and FIG. 3 the keyboard controller itself compares the shift codes with the scanned codes, whereby the hardware is simplified. When the CPU is initiallized by being provided a source program, it sends the matrix codes of the shift key preliminarily determined by the source program to the microprocessor 41. The microprocessor 41 stores the data in its memory. When the microprocessor 41 scans the key matrix and finds a depressed key, the microprocessor 41 compares the codes of the depressed key with the matrix codes of the shift key stored in memory. If the microprocessor 41 detects a comparison coincidence, the processor 41 turns on a shift bit in the status area of the memory and scans the depressed key. If plural shift keys are depressed, the microprocessor 41 turns on the corresponding shift bits of the status area allocated in the memory to the shift keys. Then as shown in FIG. 3 the microprocessor reads the data other than the shift keys and makes the most significant bit of the data sent to the CPU "1", and after this operation the microprocessor sends this data to the CPU 11 and then also sends the contents of the shift status area to the CPU. The CPU 11 generates the corresponding keycodes based on the two sets of data. However, if a shift key is not pushed down. The microprocessor makes the most significant bit of the data sent to the CPU "0" and then sends this data to the CPU without any data from the status area. The CPU 11 can then determine whether or not a shift key is depressed and can thereby ascertain proper keycodes. If only shift keys are depressed, the microprocessor 41 does not send the key data.

In the embodiment described although the keyboard controller makes the most significant bit of the matrix code "1" when the shift key is depressed and sends them to the CPU 11 with the shift status data, there is a possible alternative technique in which the microprocessor initially notifies the CPU which shift key is depressed and thereafter sends only the matrix codes. In this case a keyboard controller is necessary in order to send the data to the CPU 11 when the shift key is released.

Figure 7:
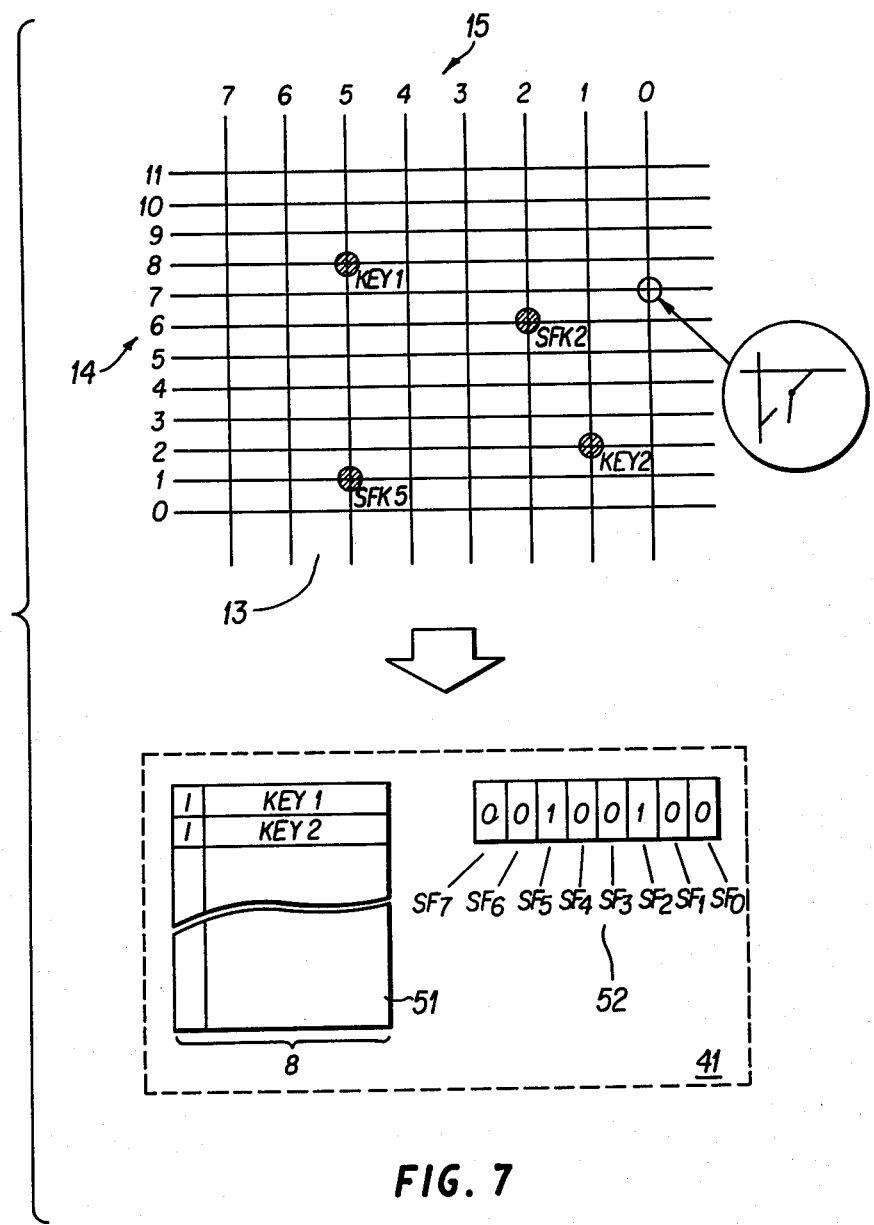
FIG. 7 is a schematic diagram of the operation of the embodiment shown in FIG. 5 when the shift keys are depressed.

Referring to FIG. 7 the processing of the embodiment in FIG. 5 is nextly described in more detail. In FIG. 7 the shift keys $SFK_2$ and $SFK_5$ and keys $KEY_1$ and $KEY_2$ of the key matrix 13 are shown depressed. The memory of the microprocessor 41, shown schematically encircled by a dashed line, provides a buffer 51 for transmission and a buffer 52 for the shift key status as shown in the memory map.

Figure 8:
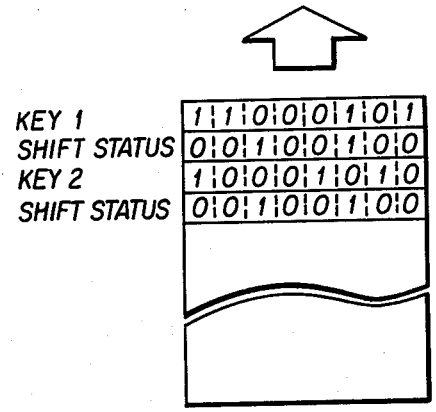
FIG. 8 is a chart illustrating the matrix coding produced by the microprocessor shown in FIG. 5 in transferring data derived from the FIG. 7 key matrix to the CPU.

The microprocessor 41 scans the key matrix 13 and confirms the four keys depressed. The microprocessor compares the scanned key matrix codes with the shift key matrix code data preliminarily sent from the CPU to detect a shift key depression and to set the particular bit of the buffer 52 indicative of the shift key status. In this case the processor sets the bits corresponding to $SF_2$ and $SF_5$. The processor stores the key matrix codes $KEY_1$ and $KEY_2$ in the buffer 51 for transmission without the shift matrix codes. When the processor confirms that at least one bit of the buffer 52 storing the shift key status is set, it sets the most significant bit of the matrix codes stored in the buffer 51 for transmission. Then the processor 41 transmits these data to the CPU 11 with the transmission states shown in the FIG. 8. The keycodes $KEY_1$ and $KEY_2$ are coded as explained in FIG. 4. In FIG. 8 the microprocessor 41 transmits the matrix codes of the $KEY_1$ first with the most significant bit set to indicate shift key depression and then sends the shift status. The microprocessor 41 then notifies the CPU of the matrix codes and the shift status of the other depressed keys in successive operations.

If it is desired to change the location of the shift keys in the key matrix, it is not necessary to change the physical location of the shift keys but only to change the shift key matrix codes in the CPU, because according to the invention, the CPU preliminarily notifies the KBC of the matrix codes of the shift keys.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A shift control system for a keyboard having plural character keys and at least one shift key arranged in a key matrix, wherein said character keys and said at least one shift key have respective positions in said matrix and said respective positions are defined by respective matrix codes, wherein a keyboard controller controls the operation of the keyboard and a central processing unit (CPU) controls operation of the keyboard controller, comprising:

notifying means for identifying the matrix code of the at least one shift key and for storing the matrix code thereof, whereby the location of said shift key in said key matrix is defined;

scanning means for scanning said key matrix and for producing matrix codes corresponding to the positions of any keys in said matrix which are depressed;

comparison means for comparing the matrix codes produced by said scanning means with the matrix code of said at least one shift key as identified by said notifying means to determine a depression of said at least one shift key, said comparison means producing a shift signal upon determining a coincidence between said matrix codes produced by said scanning means and said matrix code identified as that of said shift key;

memory means for storing said shift signal;

keycode generating means for generating a combined keycode from said shift signal stored in said memory means and the matrix code of said character key produced by said scanning which follows the storing of said shift signal; and sending means for sending the keycodes from said keycode generating means to said CPU for use thereby.

2. A shift control system according to claim 1, further comprising:

said keyboard including plural shift keys;

said notifying means identifying and sending to said keyboard controller matrix codes corresponding to respective shift keys; and at least said comparison means and said key code forming means formed of a microprocessor which upon determination of a shift key depression forms a first key code word including plural bits indicating the matrix code of a depressed character key and a status bit indicating a depression of a shift key, and a second key code identifying the depressed shift key, said first and second keycode words sent to said CPU for use thereby.

3. A shift control system according to claim 2, comprising:

said microprocessor upon determination that only character keys have been depressed forming and sending to said CPU only said first key word with the shift status bit thereof indicating that no shift key has been depressed.

4. A shift control system according to claim 1, wherein said scanning means comprises:

first means for scanning said matrix with scanning signals and for forming encoded scan codes based on said scanning signals;

second means coupled to said matrix for receiving return signals from said matrix upon scanning thereof by said scanning signals and for forming return codes based on said return signals; and first register means for storing said scan codes and said return codes.

5. A shift control system according to claim 4, further comprising:

said notifying means comprising second register means for storing the matrix code of said at least one shift key;

said comparison means comprising at least one comparator for comparing the contents of said first and second register means and for producing a shift key depression signal indicative of whether or not said at least one shift key has been depressed depending upon whether or not a coincidence is detected between the contents of said first and second registors; and said keycode forming means forming a keycode based on said shift key depression signal and the contents of said first register.

6. A shift control system according to claim 5, further comprising:

said keyboard comprising plural shift keys;

said second register means comprising plural registers for storing the matrix codes of respective shift keys;

said comparison means comprising plural comparators for comparing the contents of respective registers of said second register means with the contents of said first register means and for producing respective shift key depression signals indicative that a respective key has been depressed; and said keycode forming means forming at least one keycode based on formation of a shift key depression signal by any of said comparators and the contents of said first register means.

7. A shift control system according to claim 6 further comprising:

third register means coupled to said plural comparators for storing the shift key depression signal produced by each of said comparators, wherein the contents of third register means corresponds to the status of said shift keys and is coupled to said CPU along with said keycode.